United States Patent
Harkness, IV

(10) Patent No.: US 8,673,463 B2
(45) Date of Patent: Mar. 18, 2014

(54) METHOD TO SYNTHESIZE ORDERED MAGNETIC ALLOYS AT LOW TEMPERATURE

(75) Inventor: Samuel Dacke Harkness, IV, Berkeley, CA (US)

(73) Assignee: Seagate Technology LLC, Cupertino, CA (US)

( * ) Notice: Subject to any disclaimer, the term of this patent is extended or adjusted under 35 U.S.C. 154(b) by 1196 days.

(21) Appl. No.: 12/202,504

(22) Filed: Sep. 2, 2008

(65) Prior Publication Data

US 2010/0055499 A1   Mar. 4, 2010

(51) Int. Cl.
*G11B 5/66* (2006.01)

(52) U.S. Cl.
USPC ........................................................ 428/827

(58) Field of Classification Search
USPC .................................................. 428/827–829
See application file for complete search history.

(56) References Cited

U.S. PATENT DOCUMENTS

2006/0088733 A1* 4/2006 Hosoe et al. ................. 428/827
2006/0204791 A1* 9/2006 Sakawaki et al. .......... 428/828.1

* cited by examiner

*Primary Examiner* — Holly Rickman
*Assistant Examiner* — Linda Chau
(74) *Attorney, Agent, or Firm* — Mitchell K. McCarthy; McCarthy Law Group

(57) ABSTRACT

The present invention relates to a method of synthesizing an ordered magnetic alloy comprising obtaining a substrate and performing sequential sputter deposition of multiple atomic monolayers of the magnetic alloy.

16 Claims, No Drawings

METHOD TO SYNTHESIZE ORDERED MAGNETIC ALLOYS AT LOW TEMPERATURE

BACKGROUND

Typically, the thin-film perpendicular magnetic recording medium comprises a rigid NiP-plated Al alloy substrate, or alternatively a glass or glass-ceramic substrate, and successively sputtered layers. The sputtered layers can include one or more underlayers, one or more magnetic layers, and a protective overcoat. The protective overcoat is typically a carbon overcoat which protects the magnetic layer from corrosion and oxidation and also reduces frictional forces between the disc and a read/write head. In addition, a thin layer of lubricant may be applied to the surface of the protective overcoat to enhance the tribological performance of the head-disc interface by reducing friction and wear of the protective overcoat.

The manufacture of magnetic thin-film media may include the formation of an ordered magnetic alloy layer. However, prior art methods generally require high temperature processing where the substrate temperature is in excess of 200° C. to effect the necessary metallurgical transformation. These high temperatures are generally incompatible with standard photoresists commonly used in the lithography steps for manufacturing the magnetic thin-film media.

SUMMARY

The invention relates to a method of synthesizing an ordered magnetic alloy comprising obtaining a substrate and performing sequential sputter deposition of multiple atomic monolayers of the magnetic alloy.

Preferred embodiments of the invention are shown and described, by way of illustration of the best mode contemplated for carrying out the invention, in the following detailed description. As will be realized, this invention is capable of other and different embodiments, and its details are capable of modifications in various obvious respects, all without departing from the invention. Accordingly, the description is to be regarded as illustrative in nature and not as restrictive.

DETAILED DESCRIPTION

The present invention relates to an ordered magnetic alloy comprising multiple atomic monolayers of the magnetic alloy. The atomic monolayers may be sequentially deposited by sputter deposition. Because surface diffusion is significantly more rapid than bulk diffusion, a lower substrate temperature is required for conversion. Therefore, substrate temperatures of less than 200° C. are acceptable, making the process compatible with commonly used photoresists.

Underlayers may be deposited below the magnetic alloy monolayers with a crystal orientation such that the magnetic alloy layer has an easy axis oriented substantially in a direction perpendicular to the plane of the magnetic layer.

One embodiment of the invention is a method of synthesizing an ordered magnetic alloy comprising obtaining a substrate and performing sequential sputter deposition of multiple atomic monolayers of the magnetic alloy. The magnetic alloy, for example, may comprise Co and Pt. Alternatively, the magnetic alloy may comprise at least two elements selected from the group consisting of B, Cr, Co, Pt, Ni, Al, Si, Zr, Hf, W, C, Mo, Ru, Ta, Nb, O and N. For example, the magnetic alloy may be selected from the group consisting of CoPt, CoPtCr, CoPtCrTa, CoPtCrB, CoPtCrNb, CoPtTi, CoPtCrTi, CoPtCrSi, CoPtCrAl, CoPtCrZr, CoPtCrHf, CoPtCrW, CoPtCrC, CoPtCrMo, and CoPtCrRu.

In one variation, a temperature of the substrate is less than 200° C. In another variation, the atomic monolayers of the magnetic alloy comprise an easy axis oriented substantially in a direction perpendicular to the plane of the atomic monolayers.

Another embodiment of the invention is a method of manufacturing a magnetic recording medium comprising depositing one or more atomic monolayers of a magnetic alloy onto a substrate.

Yet another embodiment of the invention is a magnetic recording medium comprising a substrate and a magnetic recording layer, wherein the magnetic recording layer comprises a plurality of atomic monolayers of a magnetic alloy.

An additional embodiment of the invention is a recording media comprising, from the bottom to the top:

(1) Substrate: polished glass, glass ceramics, or Al/NiP.

(2) Adhesion layers to ensure strong attachment of the functional layers to the substrates. One can have more than one layer for better adhesion or skip this layer if adhesion is fine. The examples include Ti alloys.

(3) Soft underlayers (SUL) include various design types, including a single SUL, anti-ferromagnetic coupled (AFC) structure, laminated SUL, SUL with pinned layer (also called anti-ferromagnetic exchange biased layer), and so on. The examples of SUL materials include $Fe_xCo_yB_z$ based, and $Co_xZr_yNb_z/Co_xZr_yTa_z$ based series.

(4) Seed layer(s) and interlayer(s) are the template for Co (00.2) growth. Examples are RuX series of materials.

(5) Oxide containing magnetic layers (M1) can be sputtered with conventional granular media targets reactively (with $O_x$) and/or non-reactively. Multiple layers can be employed to achieve desired film property and performance. Examples of targets are $Co_{100-x-y}Pt_x(MO)_y$ and/or $Co_{100-x-y-z}Pt_x(X)_y(MO)_z$ series (X is the $3^{id}$ additives such as Cr, and M is metal elements such as Si, Ti and Nb). Besides oxides in M1, the list can be easily extended such that the magnetic grains in M1 can be isolated from each other with dielectric materials at grain boundary, such as nitrides ($M_xN_y$), carbon (C) and carbides ($M_xC_y$). The examples of sputter targets are $Co_{100-x-y}Pt_x(MN)_y$, $Co_{100-x-y}Pt_x(MC)_y$ and/or $Co_{100-x-y-z}Pt_x(X)_y(MN)_z$, $Co_{100-x-y-z}Pt_x(X)_y(MC)_z$ series.

(6) Non-oxide containing magnetic layers (M2): The sputter targets can be used including conventional longitudinal media alloys and/or alloy perpendicular media. Desired performance will be achieved without reactive sputtering. Single layer or multiple layers can be sputtered on the top of oxide containing magnetic layers. The non-oxide magnetic layer(s) will grow epitaxially from oxide granular layer underneath. The orientation could eventually change if these layers are too thick. The examples of these are $Co_{100-x-y-z-\alpha}Cr_xPt_yB_zX_\alpha Y_\beta$.

(7) Cap layer, which is optional for this design. In one variation, with dense grains and grain boundary without oxygen may not be necessary. Conventional carbon and lubrication can be adapted for the embodiment of the claimed media to achieve adequate mechanical performance.

The above layered structure of an embodiment is an exemplary structure. In other embodiments, the layered structure could be different with either less or more layers than those stated above.

Instead of the optional NiP coating on the substrate, the layer on the substrate could be any Ni-containing layer such as a NiNb layer, a Cr/NiNb layer, or any other Ni-containing layer. Optionally, there could be an adhesion layer between the substrate and the Ni-containing layer. The surface of the Ni-containing layer could be optionally oxidized.

The substrates used can be Al alloy, glass, or glass-ceramic. The magnetically soft underlayers according to present invention are amorphous or nanocrystalline and can be FeCoB, FeCoC, FeCoTaZr, FeTaC, FeSi, CoZrNb, CoZrTa, etc. The seed layers and interlayer can be Cu, Ag, Au, Pt, Pd, Ru-alloy, etc. The CoPt-based magnetic recording layer can be CoPt, CoPtCr, CoPtCrTa, CoPtCrB, CoPtCrNb, CoPtTi, CoPtCrTi, CoPtCrSi, CoPtCrAl, CoPtCrZr, CoPtCrHf, CoPtCrW, CoPtCrC, CoPtCrMo, CoPtCrRu, etc., deposited under argon gas (e.g., M2), or under a gas mixture of argon and oxygen or nitrogen (e.g., M1). Dielectric materials such as oxides, carbides or nitrides can be incorporated into the target materials also.

Embodiments of this invention include the use of any of the various magnetic alloys containing Pt and Co, and other combinations of B, Cr, Co, Pt, Ni, Al, Si, Zr, Hf, W, C, Mo, Ru, Ta, Nb, O and N, in the magnetic recording layer.

In a preferred embodiment the total thickness of SUL could be 100 to 5000 Å, and more preferably 600 to 2000 Å. There could be a more than one soft under layer. The laminations of the SUL can have identical thickness or different thickness. The spacer layers between the laminations of SUL could be Ta, C, etc. with thickness between 1 and 50 Å. The thickness of the seed layer, $t_s$, could be in the range of 1 Å<$t_s$<50 Å. The thickness of an intermediate layer could be 10 to 500 Å, and more preferably 100 to 300 Å. The thickness of the magnetic recording layer is about 50 Å to about 300 Å, more preferably 80 to 150 Å. The adhesion enhancement layer could be Ti, TiCr, Cr etc. with thickness of 10 to 50 Å. The overcoat cap layer could be hydrogenated, nitrogenated, hybrid or other forms of carbon with thickness of 10 to 80 Å, and more preferably 20 to 60 Å.

The magnetic recording medium has a remanent coercivity of about 2000 to about 10,000 Oersted, and an $M_r t$ (product of remanance, Mr, and magnetic recording layer thickness, t) of about 0.2 to about 2.0 memu/cm². In a preferred embodiment, the coercivity is about 2500 to about 9000 Oersted, more preferably in the range of about 4000 to about 8000 Oersted, and most preferably in the range of about 4000 to about 7000 Oersted. In a preferred embodiment, the $M_r t$ is about 0.25 to about 1 memu/cm², more preferably in the range of about 0.4 to about 0.9 memu/cm².

Almost all the manufacturing of a disk media takes place in clean rooms where the amount of dust in the atmosphere is kept very low, and is strictly controlled and monitored. After one or more cleaning processes on a non-magnetic substrate, the substrate has an ultra-clean surface and is ready for the deposition of layers of magnetic media on the substrate. The apparatus for depositing all the layers needed for such media could be a static sputter system or a pass-by system, where all the layers except the lubricant are deposited sequentially inside a suitable vacuum environment.

The layers constituting magnetic recording media of the present invention may be deposited or otherwise formed by any suitable physical vapor deposition technique (PVD), e.g., sputtering, or by a combination of PVD techniques, i.e., sputtering, vacuum evaporation, etc., with sputtering being preferred. The carbon overcoat is typically deposited with sputtering or ion beam deposition. The lubricant layer is typically provided as a topcoat by dipping of the medium into a bath containing a solution of the lubricant compound, followed by removal of excess liquid, as by wiping, or by a vapor lube deposition method in a vacuum environment.

Sputtering is perhaps the most important step in the whole process of creating recording media. There are two types of sputtering: pass-by sputtering and static sputtering. In pass-by sputtering, disks are passed inside a vacuum chamber, where they are deposited with the magnetic and non-magnetic materials that are deposited as one or more layers on the substrate when the disks are moving. Static sputtering uses smaller machines, and each disk is picked up and deposited individually when the disks are not moving. The layers on the disk of the embodiment of this invention were deposited by static sputtering in a sputter machine. As described above, in the present invention, at least one magnetic alloy is deposited by sequential sputter deposition of atomic monolayers.

The sputtered layers are deposited in what are called bombs, which are loaded onto the sputtering machine. The bombs are vacuum chambers with targets on either side. The substrate is lifted into the bomb and is deposited with the sputtered material.

A layer of lube is preferably applied to the carbon surface as one of the topcoat layers on the disk.

Sputtering leads to some particulates formation on the post sputter disks. These particulates need to be removed to ensure that they do not lead to the scratching between the head and substrate. Once a layer of lube is applied, the substrates move to the buffing stage, where the substrate is polished while it preferentially spins around a spindle. The disk is wiped and a clean lube is evenly applied on the surface.

Subsequently, in some cases, the disk is prepared and tested for quality thorough a three-stage process. First, a burnishing head passes over the surface, removing any bumps (asperities as the technical term goes). The glide head then goes over the disk, checking for remaining bumps, if any. Finally the certifying head checks the surface for manufacturing defects and also measures the magnetic recording ability of the disk.

The above description is presented to enable a person skilled in the art to make and use the invention, and is provided in the context of a particular application and its requirements. Various modifications to the preferred embodiments will be readily apparent to those skilled in the art, and the generic principles defined herein may be applied to other embodiments and applications without departing from the spirit and scope of the invention. Thus, this invention is not intended to be limited to the embodiments shown, but is to be accorded the widest scope consistent with the principles and features disclosed herein.

The implementations described above and other implementations are within the scope of the following claims.

What is claimed is:

1. A magnetic recording medium comprising a substrate and an ordered magnetic recording layer over the substrate, wherein the ordered magnetic recording layer comprises a plurality of individually sputtered and likewise individually ordered atomic monolayers of a magnetic alloy.

2. The magnetic recording medium of claim 1, wherein the magnetic alloy comprises Co and Pt.

3. The magnetic recording medium of claim 1, wherein the magnetic alloy comprises at least two elements selected from the group consisting of B, Cr, Co, Pt, Ni, Al, Si, Zr, Hf, W, C, Mo, Ru, Ta, Nb, O and N.

4. The magnetic recording medium of claim 1, wherein the magnetic alloy is selected from the group consisting of CoPt, CoPtCr, CoPtCrTa, CoPtCrB, CoPtCrNb, CoPtTi, CoPtCrTi, CoPtCrSi, CoPtCrAl, CoPtCrZr, CoPtCrHf, CoPtCrW, CoPtCrC, CoPtCrMo, and CoPtCrRu.

5. The magnetic recording medium of claim 1, wherein the substrate is at a temperature of less than 200° C.

6. The magnetic recording medium of claim 1, wherein the atomic monolayers of the magnetic alloy comprise an easy axis oriented substantially in a direction perpendicular to the plane of the atomic monolayers.

7. The magnetic recording medium of claim 1, wherein the magnetic recording layer comprises an oxide.

8. The magnetic recording medium of claim 1, wherein the magnetic recording layer comprises magnetic grains separated by a dielectric material at grain boundaries, and wherein the dielectric material is selected from the group consisting of nitrides, carbon and carbides.

9. The magnetic recording medium of claim 1, wherein the magnetic recording layer comprises an oxide-containing magnetic layer with a non-oxide containing magnetic layer epitaxially grown thereon.

10. The magnetic recording medium of claim 1, further comprising a cap layer on the magnetic recording layer.

11. The magnetic recording medium of claim 1, wherein the magnetic recording layer is on a seed layer, and wherein the seed layer comprises Ru.

12. A magnetic recording medium made by the process of sequentially sputter depositing multiple individually ordered atomic monolayers of a magnetic alloy on a substrate, wherein the temperature of the substrate during each sequential sputter depositing is less than 200° C.

13. The magnetic recording medium of claim 12, wherein the atomic monolayers of the magnetic alloy comprise an easy axis oriented substantially in a direction perpendicular to the plane of the atomic monolayers.

14. The magnetic recording medium of claim 12, wherein the t magnetic alloy comprises Co and Pt.

15. The magnetic recording medium of claim 12, wherein the magnetic alloy comprises at least two elements selected from the group consisting of B, Cr, Co, Pt, Ni, Al, Si, Zr, Hf, W, C, Mo, Ru, Ta, Nb, O and N.

16. The magnetic recording medium of claim 12, wherein the magnetic alloy is selected from the group consisting of CoPt, CoPtCr, CoPtCrTa, CoPtCrB, CoPtCrNb, CoPtTi, CoPtCrTi, CoPtCrSi, CoPtCrAl, CoPtCrZr, CoPtCrHf, CoPtCrW, CoPtCrC, CoPtCrMo, and CoPtCrRu.

* * * * *